United States Patent
Frick et al.

(10) Patent No.: US 9,426,898 B2
(45) Date of Patent: Aug. 23, 2016

(54) THERMOCOMPRESSION BONDERS, METHODS OF OPERATING THERMOCOMPRESSION BONDERS, AND INTERCONNECT METHODS FOR FINE PITCH FLIP CHIP ASSEMBLY

(71) Applicant: Kulicke and Soffa Industries, Inc., Fort Washington, PA (US)

(72) Inventors: Guy Frick, Maple Glen, PA (US); Thomas J. Colosimo, Jr., West Chester, PA (US); Horst Clauberg, Warwick, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 14/750,186

(22) Filed: Jun. 25, 2015

(65) Prior Publication Data
US 2015/0382480 A1    Dec. 31, 2015

Related U.S. Application Data

(60) Provisional application No. 62/019,053, filed on Jun. 30, 2014.

(51) Int. Cl.
*B23K 31/02*    (2006.01)
*H05K 3/34*    (2006.01)
(Continued)

(52) U.S. Cl.
CPC .............. *H05K 3/34* (2013.01); *B23K 1/0016* (2013.01); *B23K 1/203* (2013.01); *B23K 3/04* (2013.01); *B23K 3/082* (2013.01); *B23K 2201/42* (2013.01); *H05K 2203/04* (2013.01)

(58) Field of Classification Search
CPC ............ B23K 2201/36–2201/42; B23K 1/203; B23K 3/082; B23K 1/0016; B23K 3/04; H05K 3/34; H05K 2203/04
USPC .......................... 228/4.1, 6.2, 44.7, 49.5, 52, 228/180.1–180.22, 33, 207, 214, 223, 37, 228/41
See application file for complete search history.

(56) References Cited

U.S. PATENT DOCUMENTS

| | | | | |
|---|---|---|---|---|
| 3,834,604 A | * | 9/1974 | Fendley | H01L 21/4853 228/15.1 |
| 3,939,559 A | * | 2/1976 | Fendley | B23K 20/00 228/106 |

(Continued)

FOREIGN PATENT DOCUMENTS

| | | | |
|---|---|---|---|
| JP | 03248544 A | * | 11/1991 |
| JP | 09008439 A | * | 1/1997 |

(Continued)

OTHER PUBLICATIONS

Behler, Stefan and Harmann, Dominik, "Comparison of Flux Application Methods for Flip Chip Die Bonding." Semicon, Singapore, 2001, 11pgs.

*Primary Examiner* — Kiley Stoner
(74) *Attorney, Agent, or Firm* — Stradley Ronon Stevens & Young, LLP

(57) ABSTRACT

A thermocompression bonder is provided. The thermocompression bonder includes: a bond head including a heated bonding tool for bonding a semiconductor element to a substrate; and a flux application tool for applying a flux material to conductive contacts of the substrate prior to bonding of the semiconductor element to the substrate.

19 Claims, 6 Drawing Sheets

(51) Int. Cl.
*B23K 1/00* (2006.01)
*B23K 1/20* (2006.01)
*B23K 3/04* (2006.01)
*B23K 3/08* (2006.01)

(56) References Cited

U.S. PATENT DOCUMENTS

| | | | | |
|---|---|---|---|---|
| 5,128,746 | A * | 7/1992 | Pennisi | B23K 35/3613 257/673 |
| 9,184,112 | B1 * | 11/2015 | Gambino | H01L 23/481 |
| 2002/0142517 | A1 * | 10/2002 | Maeda | H01L 24/81 438/108 |
| 2006/0030075 | A1 * | 2/2006 | Sugiyama | H01L 21/563 438/108 |
| 2006/0033214 | A1 * | 2/2006 | Tomono | H01L 21/563 257/772 |
| 2006/0076692 | A1 * | 4/2006 | Lee | H01L 24/29 257/778 |
| 2008/0003804 | A1 * | 1/2008 | Nalla | B23K 3/0623 438/613 |
| 2011/0115084 | A1 * | 5/2011 | Ueshima | B23K 35/262 257/738 |
| 2013/0263446 | A1 * | 10/2013 | Nagarajan | H01L 24/81 29/840 |
| 2015/0155254 | A1 | 6/2015 | Schmidt-Lange et al. | |

FOREIGN PATENT DOCUMENTS

| | | | | |
|---|---|---|---|---|
| JP | 10022350 | A * | 1/1998 | |
| JP | 2001291740 | A * | 10/2001 | |
| JP | 3309718 | B2 * | 7/2002 | H01L 24/81 |
| JP | 2007189210 | A * | 7/2007 | |
| JP | 2012015262 | A * | 1/2012 | |
| WO | WO 0216068 | A2 * | 2/2002 | B23K 1/203 |

* cited by examiner

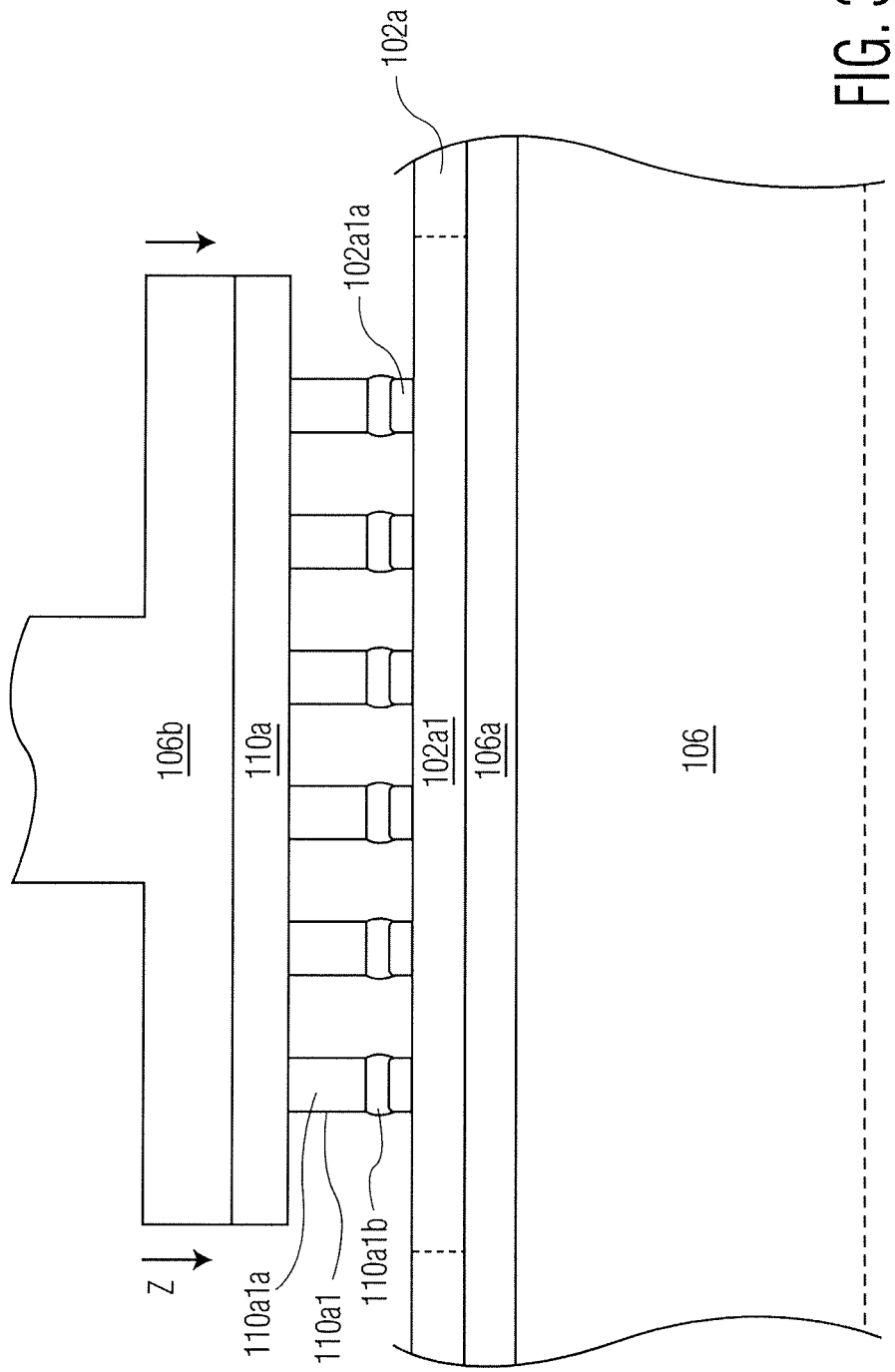

THERMOCOMPRESSION BONDERS, METHODS OF OPERATING THERMOCOMPRESSION BONDERS, AND INTERCONNECT METHODS FOR FINE PITCH FLIP CHIP ASSEMBLY

RELATED APPLICATION

This application claims the benefit of priority to U.S. Provisional Patent Application Ser. No. 62/019,053, filed Jun. 30, 2014, the contents of which are incorporated in this application by reference.

FIELD

The present invention relates to the formation of electrical interconnections in semiconductor packages, and more particularly, to improved thermocompression bonding systems and methods of operating the same.

BACKGROUND

In the processing and packaging of semiconductor devices, in the interconnection of certain devices, flip chip and thermocompression bonding techniques are used. In connection with such techniques, a first substrate (e.g., a die) is bonded to a second substrate (e.g., a wafer, another die, another substrate such as a leadframe, etc). Generally, the first substrate is a semiconductor element. There are conductive structures/contacts (e.g., pillars, traces, etc.) on each of the first and the second substrate. For example, on the first substrate (e.g., a die) the conductive traces may be conductive structures, such as copper pillars with solder on an end portion of the pillars. During thermocompression bonding the solder is melted, and then re-solidified, thereby bonding the conductive structures/contacts on the first substrate to those on the second substrate.

In conventional thermocompression bonding, the substrate to which a semiconductor element will be bonded may be coated with a material such as an OSP (i.e., organic solderability preservative). This material should be removed before the solder interconnection is formed. Removal of this OSP material is one of the functions of a flux material. Typically, the flux material is applied to the contact surface of a die and the removal of the OSP is accomplished after the conductive structures of the die and the substrate have been brought into contact with one another.

The process of removing the material is time consuming, as it requires a separate fluxing process, and time for the material to be removed (e.g., dissolved, burned off, etc.)

Thus, it would be desirable to provide improved systems and methods providing interconnection of devices in flip chip and related applications.

SUMMARY

According to an exemplary embodiment of the present invention, a thermocompression bonder is provided. The thermocompression bonder includes a bond head including a heated bonding tool for bonding a semiconductor element to a substrate; and a flux application tool for applying a flux material to conductive contacts of the substrate prior to bonding of the semiconductor element to the substrate.

According to another exemplary embodiment of the present invention, a method of operating a thermocompression bonding machine is provided. The method includes: (a) applying a flux material to conductive structures on a substrate using a flux application tool of the thermocompression bonding machine; and (b) thermocompressively bonding conductive structures of a semiconductor element to conductive structures of the substrate after step (a).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 3A-3B are block diagram illustrations of a thermocompression bonding process in accordance with an exemplary embodiment of the present invention;

DETAILED DESCRIPTION

Figure 1:
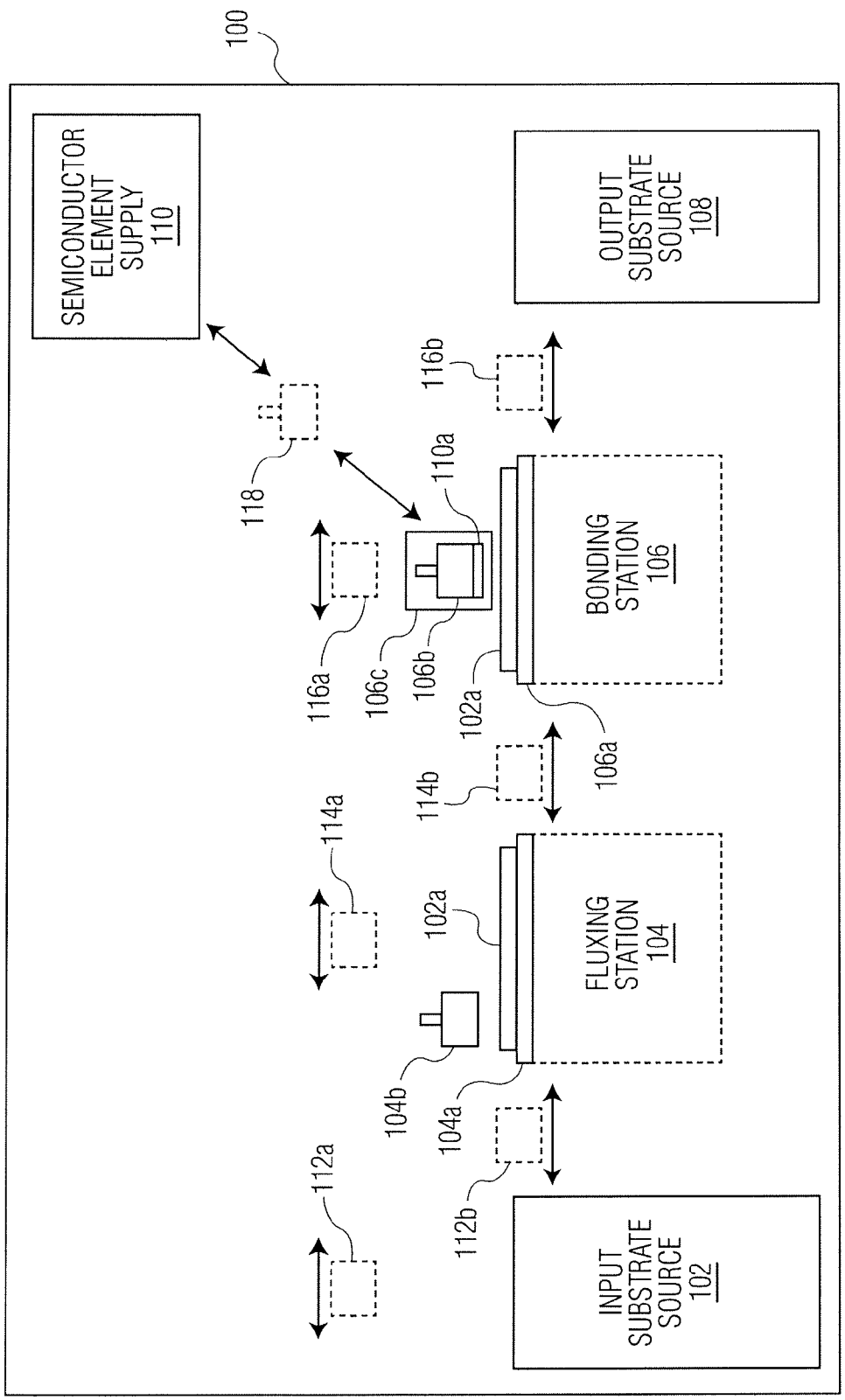
FIG. 1 is a block diagram view of a thermocompression bonder in accordance with an exemplary embodiment of the present invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, an interposer (e.g. glass or silicon substrate with fine pitch circuitry), amongst others.

As used herein, the terms "substrate" and "workpiece" are intended to refer to any structure to which a semiconductor element may be bonded (e.g., thermocompressively bonded, etc.). Exemplary substrates include, for example, a leadframe, a PCB, a carrier, a semiconductor chip, a semiconductor wafer, a BGA substrate, a semiconductor element, an interposer (e.g. glass or silicon substrate with fine pitch circuitry), etc.

According to certain exemplary embodiments of the present invention, methods of joining a first substrate to a second substrate (e.g., in a flip chip thermocompression bonding application) are provided.

According to one exemplary method, a flux application tool is used to apply flux material (useful for removing OSP material, but also used as flux to remove surface oxides in the thermocompression bonding operation) to conductive contacts of a substrate to which a semiconductor element will be thermocompressively bonded. For example, the flux material may be applied at a separate fluxing station upstream of the bonding station (where the bonding station is the location where a semiconductor element held by a heated bonding tool is thermocompressively bonded to a substrate). At the fluxing station, flux material may be applied to a plurality of the conductive contacts of the substrate (e.g., all of the contacts, a portion of the contacts, etc.) at one time in a gang stamping approach. In another example, flux material may be applied using a flux "printer" by applying flux material (e.g., as flux dots applied by a jet) to the desired areas of the substrate. In yet another example, a flux jet/nozzle may be used to apply the flux material. The substrate may be heated at the flux station to activate the applied flux material but not so hot as to evaporate the flux material (e.g., the substrate may be heated to 70 degrees Celsius, of course, it being understood that the temperature depends on factors such as flux properties) to clean the conductive contacts in advance of the solder reflow process at the bonding station.

After the flux material is applied, the heated bonding tool carrying the semiconductor element to be bonded moves toward the substrate. The bonding tool is carried by a bond head assembly including a heater, a z-axis motion system, often a load cell amongst other elements. The heater is used to heat the semiconductor element such that solder on the conductive structures (e.g., conductive pillars) is heated, but not melted. For example, if the solder melts at a temperature of approximately 210-220 degrees Celsius, the heater may be used to heat the semiconductor element to a temperature of 200 degrees Celsius. Specific exemplary ranges include: heating the solder to a temperature of 1-30 (or 1-20, or 1-10) degrees Celsius below the melt temperature before contact between the conductive structures of the semiconductor element and the substrate; heating the solder to a temperature that is no less than 30 degrees Celsius below the melt temperature (but that is still below the melt temperature) before contact between the conductive structures of the semiconductor element and the substrate; heating the solder to a temperature that is no less than 20 degrees Celsius below the melt temperature (but that is still below the melt temperature) before contact between the conductive structures of the semiconductor element and the substrate; heating the solder to a temperature that is no less than 10 degrees Celsius below the melt temperature (but that is still below the melt temperature) before contact between the conductive structures of the semiconductor element and the substrate; etc.

The conductive structures of the semiconductor element are then brought into contact with conductive contacts (e.g., traces) on the substrate. By this time, the coated material (e.g., OSP) has been removed from the substrate using the flux material. Then, the heater raises the temperature to melt the solder on the contacts of the semiconductor element. At this time, the bond head assembly may be operated, for example in a position mode, controlled using a z-axis motor for driving the bond head.

Melting of the solder may be detected in this position, for example, using the load cell to detect a change in force. That is, when the solder is solid, there is a certain amount of force sensed by the load cell along the z-axis in the position mode. As the solder melts, the force sensed by the load cell changes in such a way that it can be determined that the solder has melted.

After the solder has melted, a predetermined time may be allowed to elapse, for the solder to flow, etc. For example, this time may vary in a given application based on temperature, type of flux, etc. An exemplary range for this time is 100-400 milliseconds. After this time elapses, cooling provided in the bond head is activated to solidify the solder. After the bond head has cooled sufficiently to solidify the solder, the vacuum is released from the bond head assembly and the bond head assembly (e.g., the bonding tool on the bond head assembly) is lifted up to separate it from the semiconductor element.

Thus, a new innovative method of joining the interface between a semiconductor element and a substrate has been invented. Exemplary inventive aspects include: a specific substrate fluxing method (pre-fluxing using a fluxing tool, to save time); making contact between the contacts of the semiconductor element and the substrate very near, but just below, the melting point of solder, followed by rapid heating, followed by cooling, of the bond head; using precision contact detection (and possibly position control of the bond head) to not over deform the softened solder bump; determining the timing of the melting in order to time the solder melting precisely, thereby improving UPH; holding the bond head in position mode (not force mode) so as to not over deform the small solder joint; and using a high temperature die transfer so that time is not lost during cooling.

FIG. 1 is a block diagram illustration of a thermocompression flip chip bonding machine 100 (i.e., a thermocompression bonder 100). Machine 100 includes semiconductor element supply 110 (e.g., a wafer or other source of semiconductor elements). Semiconductor elements 110a from supply 110 are thermocompressively bonded to substrates 102a using bonding tool 106b (where bonding tool 106b is part of a bond head 106c of machine 100). Substrates 102a are provided from input substrate source 102 (e.g., an input magazine). A motion system is used to move a substrate 102a from source 102 to fluxing station 104. The motion system is part of a material handling system for moving substrates 102a through the thermocompression bonding process of machine 100. For example, the motion system may be an overhead motion tool 112a (shown in dotted lines in FIG. 1) which grabs a substrate 102a from above and moves the substrate 102a to fluxing station 104. In another example, the motion system may be a "gripper" type motion tool 112b (shown in dotted lines in FIG. 1) which grips a substrate 102a from the side (e.g., along an edge) and pulls the substrate 102a to support structure 104a of fluxing station 104. Other types of motion systems are contemplated.

Fluxing station 104 includes a support structure 104a (e.g., a heatable support structure for activating the flux material) for supporting substrate 102a during the application of the flux material by flux application tool 104b. Flux application tool 104b applies flux material to conductive structures/contacts of substrate 102a. As will be appreciated by those skilled in the art, the flux material may be applied: liberally over an area of substrate 102a including the conductive structures/contacts; selectively just on the conductive structures/contacts; etc. Application of the flux material by flux application tool 104b may include electronically controlling application of the flux material, for example, using a computer of thermocompression bonder 100 (not shown for simplicity).

After the flux material is applied at flux station 104, a motion system is used to move a substrate 102a from fluxing station 104 to bonding station 106. The motion system is part of a material handling system of machine 100. For example, the motion system may be an overhead motion tool 114a (shown in dotted lines in FIG. 1) which grabs substrate 102a from above and moves substrate 102a to bonding station 106. In another example, the motion system may be a "gripper" type motion tool 114b (shown in dotted lines in FIG. 1) which grips a substrate 102a from the side and pulls the substrate 102a to support structure 106a of bonding station 106. Other types of motion systems are contemplated.

Bonding station 106 includes a support structure 106a for supporting substrate 102a during a thermocompression bonding process. Heated bonding tool 106b bonds semiconductor element 110a to substrate 102a (e.g., by melting and re-solidifying solder material, as described below in connection with FIGS. 3A-3B). Because the flux material has been applied at flux station 104, OSP material (or other foreign matter) may have been removed (or substantially removed), without evaporating the flux material such that the flux material can still provide a fluxing effect during the thermocompression bonding process at bonding station 106. Semiconductor elements 110a are obtained from semiconductor element supply 110 (e.g., a wafer 110). Semiconductor elements 110a may be picked directly from supply 110 using bonding tool 106b. Alternatively, one or more transfer mechanisms 118 (shown in dotted lines in FIG. 1) may be provided to pick a semiconductor element 110a from supply 110 and transfer the element 110a to bonding tool 106b.

After the thermocompression bonding process is complete at bonding station 106, a motion system is used to move a substrate 102a from bonding station 106 to output substrate source 108. The motion system is part of a material handling system of machine 100. For example, the motion system may be an overhead motion tool 116a (shown in dotted lines in FIG. 1) which grabs substrate 102a from above and moves substrate 102a to source 108. In another example, the motion system may be a "gripper" type motion tool 116b (shown in dotted lines in FIG. 1) which grips a substrate 102a from the side and pulls the substrate 102a to source 108. In any event, after the thermocompression process is complete at bonding station 106 (which may include the bonding of multiple semiconductor elements on each substrate 102a), the "bonded" substrate 102a is moved to output substrate source 108 (e.g., an output magazine).

Figure 2A:
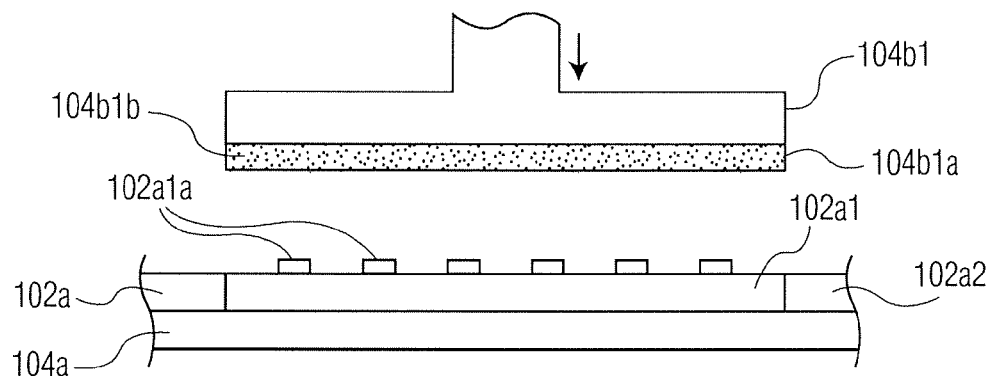
FIGS. 2A-2C are block diagram illustrations of flux application tools in accordance with various exemplary embodiments of the present invention.
Figure 2B:
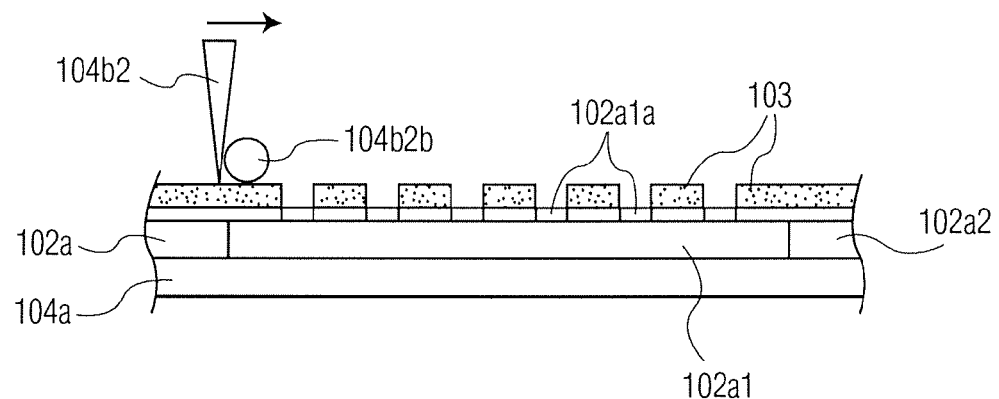
Figure 2C:
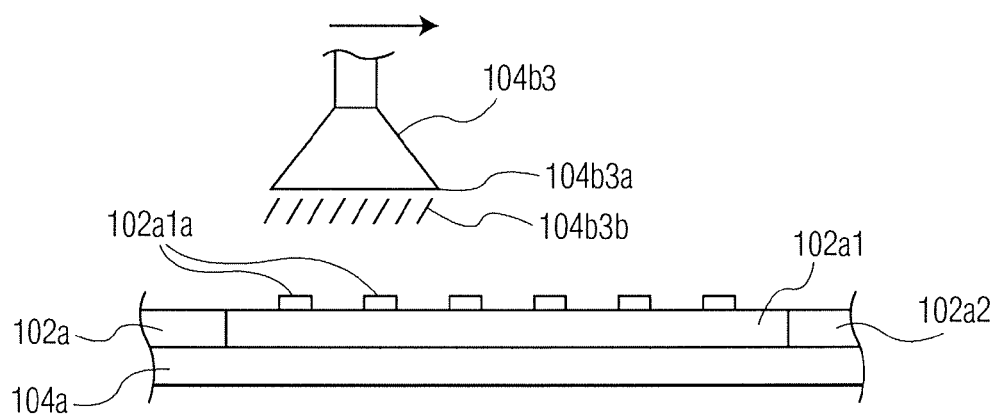

As will be appreciated by those skilled in the art, flux application tool 104b, which is configured to apply a flux material to conductive contacts of a substrate 102a, may take a number of different forms. Exemplary flux application tools include a flux stamp, a flux jet, a flux printer, a flux screen printer, etc. FIGS. 2A-2C illustrate exemplary flux application tools 104b1 (e.g., a flux stamp), 104b2 (e.g., a flux printer, a flux screen printer, etc.), and 104b3 (e.g., a flux jet) configured for use at flux station 104.

Referring specifically to FIG. 2A, substrate 102a (supported by support structure 104a of fluxing station 104) includes a bonding location 102a1, which is one of a plurality of similar bonding locations on the substrate 102a (where bonding location 102a1 is another such bonding location). While FIG. 2A (and other drawings herein) illustrate bonding location 102a1 directly adjacent another bonding location 102a2, it is understood that there may be considerable spacing between the various bonding locations of substrate 102a.

Bonding location 102a1 is the portion of substrate 102a shown in detail in FIG. 2A. Bonding location 102a1 includes conductive contacts 102a1a (while only 6 contacts 102a1 are shown in FIG. 2A, it is understood that many more contacts 102a1 may be included on bonding location 102a1). Flux application tool 104b1 is lowered to apply a flux material to contacts 102a1a. Tool 104b1 includes contact region 104b1a which holds flux material 104b1b. For example, contact region 104b1a may be a stamp (e.g., a rubber or other elastomeric material region) used to "stamp" flux material 104b1b onto conductive contacts 102a1. In another example, contact region 104b1a may include a porous contact region holding flux material 104b1b for stamping onto conductive contacts 102a1a.

Referring specifically to FIG. 2B, a screen/mask 103 is provided over a portion of substrate 102a such that only an upper surface of conductive contacts 102a1a are exposed for application of a flux material. In the example shown in FIG. 2B, flux application tool 104b2 is configured to move laterally (e.g., to the right as shown with an arrow in FIG. 2B) to spread/drag flux material 104b2b across the upper surface of substrate 102a. Tool 104b2 may be considered as to be a "squeegee" type tool (e.g., a scraping implement with a elastomeric/rubber edge for spreading the flux material) for applying flux material 104b2b to the upper surface of contacts 102a1a. After application of flux material 104b2b, screen/mask 103 may be removed.

Referring specifically to FIG. 2C, another example flux application tool 104b3 is configured to spray flux material 104b3b through output jet portion 104b3a onto contacts 102a1a.

Of course, FIGS. 2A-2C simply represent examples of systems and techniques for applying flux material to contacts 102a1a of substrate 102a. Other types of systems and techniques are contemplated within the scope of the present invention.

Figure 3A:
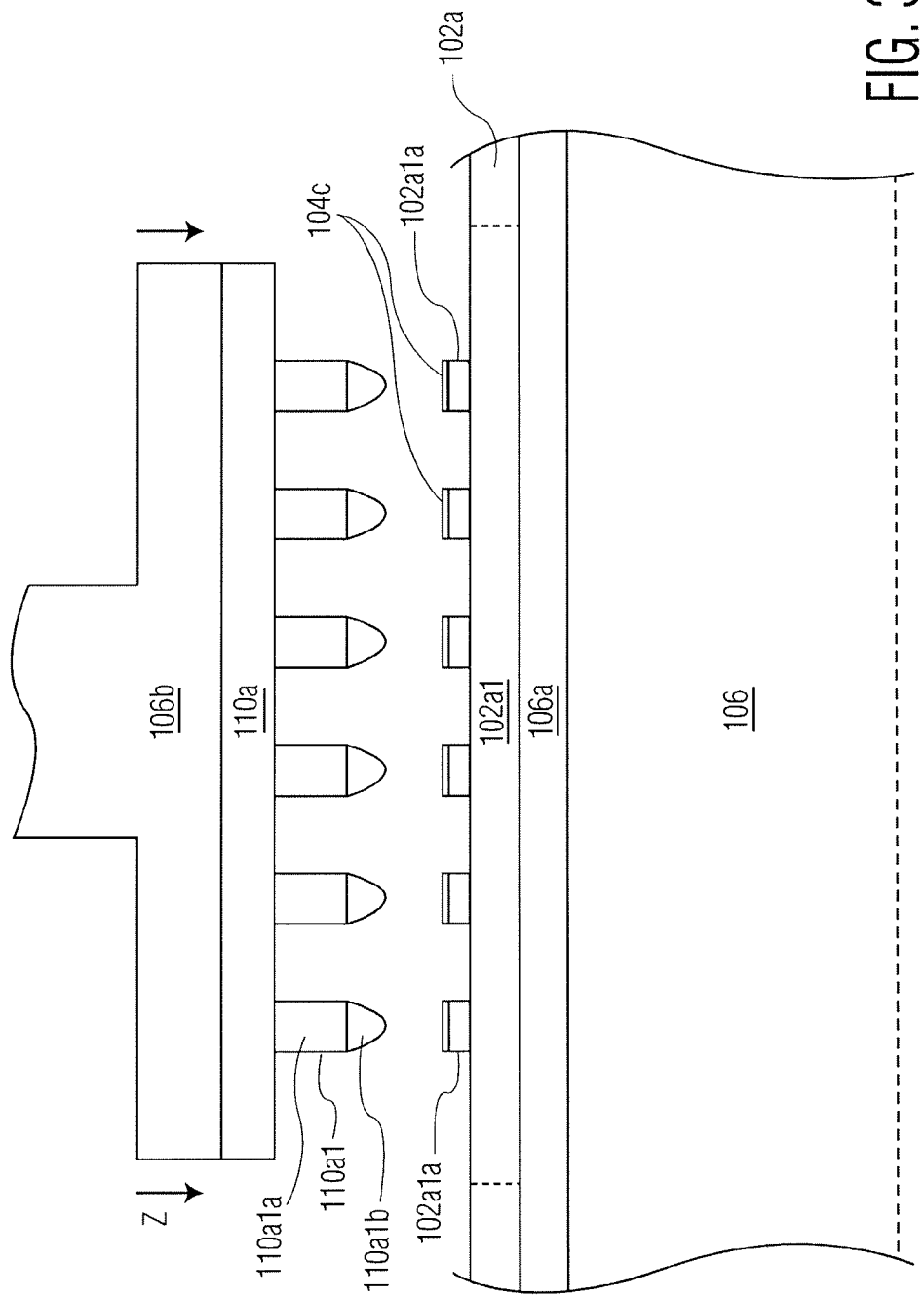

FIGS. 3A-3B illustrates portions of bonding station 106 of thermocompression bonding machine 100. Bonding station 106 includes support structure 106a (e.g., a bond stage such as a shuttle, a heated shuttle, a heat block, an anvil, etc.). Support structure 106a may include an application specific part (not shown distinct from the remainder of support structure 106a). Substrate 102a is supported by support structure 106a, and includes a plurality of bonding locations 102a1, etc. as described above. Bonding location 102a1 of substrate 102a includes a plurality of lower conductive structures 102a1a (e.g., conductive traces, conductive pads, etc.). Conductive structures 102a1a are illustrated as including a layer of flux material 104c applied at flux station 104.

Bonding station 106 also includes bonding tool 106b (e.g., carried by a bond head 106c, not shown in FIGS. 3A-3B but see FIG. 1) carrying semiconductor element 110a. Upper conductive structures 110a1 (e.g., conductive pillars such as copper pillars 110a1a, shown including solder contact portions 110a1b or solder bumps 110a1b) are provided on semiconductor element 110a. Bonding tool 106b is lowered such that upper conductive structures 110a1 contact lower conductive structures 102a1a (e.g., see FIG. 3B). As illustrated in FIG. 3B, through a thermocompressive bonding process solder contact portions 110a1b are melted, and then re-solidified, providing a permanent conductive coupling between ones of upper conductive structures 110a1 and lower conductive structures 102a1a. Although FIGS. 3A-3B illustrate only six sets of upper/lower conductive structures, this is of course a simple example for ease of explanation. In practice, any number of pairs of conductive structures may be provided (e.g., tens of conductive structure pairs, hundreds of conductive structure pairs, etc.).

In accordance with certain exemplary embodiments of the present invention, semiconductor element 110a may be heated to a higher than normal temperature by heated bonding tool 106b prior to bonding at bonding station 106. That is, just prior to bonding at bonding station 106, heated bonding tool 106b may heat semiconductor element 110a to a temperature close to, but just below, the melting temperature of the solder contact portions (e.g., portions 110a1b shown in FIGS. 3A-3B) of the upper conductive structures on semiconductor element 110a. Through this heating process, the UPH (i.e., units per hour) of the thermocompression bonding machine is increased because the solder contact portions may be melted (and hence re-solidified) faster after contact between ones of the upper conductive structures of semiconductor element 110a and the lower conductive structures of substrate 102a. Furthermore, the temperature range through which bonding tool 106b must be heated and cooled from semiconductor pick-up to bonding is reduced, saving valuable time in the temperature heating and cooling.

Figure 4:
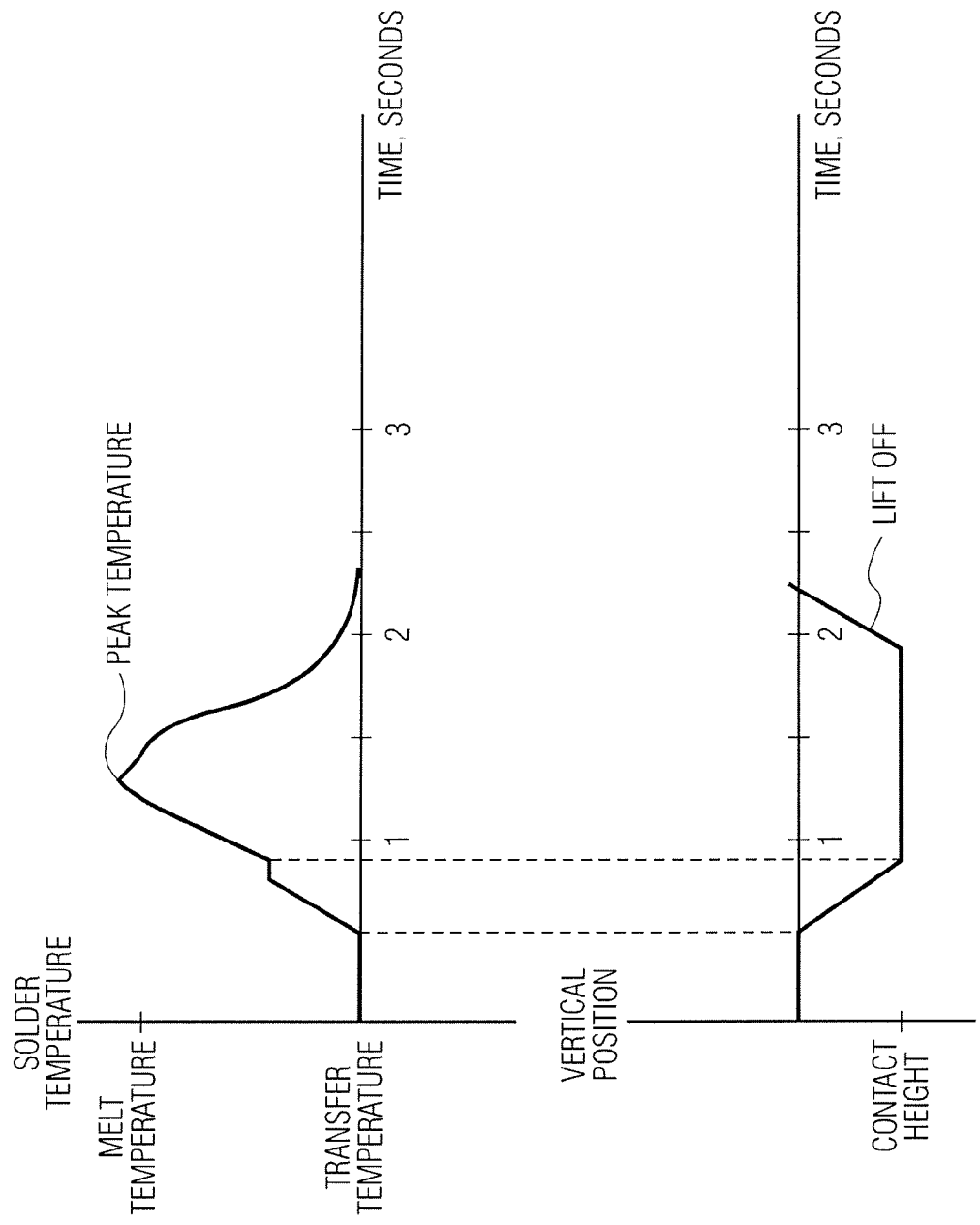
FIG. 4 is a timing diagram illustrating aspects of a thermocompression bonding process in accordance with an exemplary embodiment of the present invention.

FIG. 4 illustrates an exemplary timing diagram including solder temperature (the upper half of the diagram) and the vertical bonding tool position (the lower half of the diagram).

At time=0, the semiconductor element 110a (including the solder contact portions) is at the transfer temperature—that is, the temperature at which the semiconductor element 110a was transferred to the bonding tool 106 (e.g., by direct pick from supply 110 by bonding tool 106b, by transfer from one or more transfer tools 118 to bonding tool 106b, etc.). At this transfer temperature, the solder contact portions are still solid, that is, the solder contact portions are below the melt temperature of the solder contact portions. At time=0, bonding tool 106b is at a stable position above the contact height (i.e., the height where the upper conductive structures of semiconductor element 110a and the lower conductive structures of substrate 102a are in contact with one another). At approximately time=0.5 seconds, bonding tool 106b begins to descend toward the contact height. At the same time, bonding tool 106b is heating semiconductor element 110a, bringing the temperature close to, but below, the melt temperature. Just before time=1 second, the contact height is reached, and the temperature is ramped up (e.g., using heated bonding tool 106b) such that the temperature exceeds the melt temperature and the solder contact portions melt. Just before time=2 seconds, the temperature has been reduced (e.g., through active cooling in bonding tool 106b) and the solder contact portions have re-solidified. At this time, bonding tool 106b is raised to lift off from semiconductor element 110a. A permanent conductive connection is established between ones of upper conductive structures of semiconductor element 110a and the lower conductive structures of substrate 102a. Of course, FIG. 4 is an exemplary timing diagram, and is not limiting. For example, the profile/slope of the temperature ramp up concurrent with the descent of bonding tool 106b is exemplary in nature and may vary widely within the scope of the present invention. Furthermore, the transfer temperature at time=0 may be very close to or even the same as the contact temperature just below the melting temperature.

Figure 5:
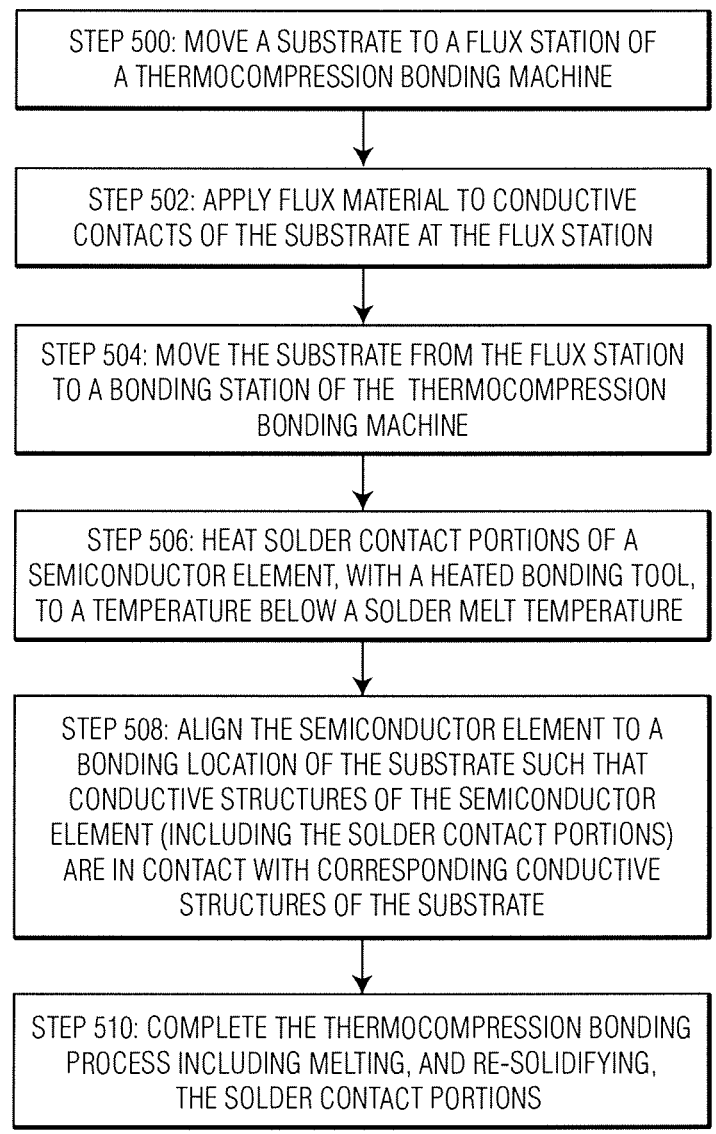
FIG. 5 is a flow diagram illustrating a method of operating a thermocompression bonder in accordance with an exemplary embodiment of the present invention.

FIG. 5 is a flow diagram illustrating a method of operating a thermocompression bonding machine in accordance with certain exemplary embodiments of the present invention. As is understood by those skilled in the art, certain steps included in the flow diagram may be omitted; certain additional steps may be added; and the order of the steps may be altered from the order illustrated.

At step 500, a substrate is moved to a flux station of a thermocompression bonding machine (e.g., substrate 102a is moved from source 102 to fluxing station 104 using motion tool 112a/112b as shown in FIG. 1). At step 502, flux material is applied to conductive contacts of the substrate at the flux station (e.g., the flux material is applied using flux application tool 104b of FIG. 1, such as one of flux application tools 104b1, 104b2, or 104b3). At step 504, the substrate is moved from the flux station to a bonding station of the thermocompression bonding machine (e.g., substrate 102a is moved from fluxing station 104 to bonding station 106 using motion tool 114a/114b as shown in FIG. 1). At step 506, solder contact portions of a semiconductor element are heated with a heated bonding tool (e.g., bonding tool 106b) to a temperature below a solder melt temperature. At step 508, the semiconductor element is aligned to a bonding location of the substrate such that conductive structures of the semiconductor element (including the solder contact portions) are in contact with corresponding conductive structures of the substrate. At step 510, the thermocompression bonding process is completed including melting, and re-solidifying, the solder contact portions (e.g., see FIGS. 3A-3B).

As will be appreciated by those skilled in the art, various structures of thermocompression bonder 100 (or other machines within the scope of the present invention) may have desired motion axes. For example, any of support structure 104a, support structure 106a, flux application tool 104b, bond head 106c, and bonding tool 106b may be configured to move along an x-axis, along a y-axis, along a z-axis, and/or about a theta axis, of the machine, as desired.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A thermocompression bonder comprising:
   a bonding station of the thermocompression bonder, the bonding station including (a) a support structure of the bonding station for supporting a substrate during bonding of a semiconductor element to the substrate, and (b) a bond head including a heated bonding tool for bonding the semiconductor element to the substrate;
   a fluxing station of the thermocompression bonder, the fluxing station including (a) a movable flux application tool for applying a flux material to conductive contacts of the substrate prior to bonding of the semiconductor element to the substrate by the heated bonding tool, (b) a support structure of the fluxing station for supporting the substrate during application of the flux material by the flux application tool; and
   a material handling system for moving the substrate from the fluxing station to the bonding station.

2. The thermocompression bonder of claim 1 wherein the flux application tool includes at least one of a flux stamp, a flux jet, a flux printer, and a flux screen printer.

3. The thermocompression bonder of claim 1 wherein the support structure included in the fluxing station is different from the support structure included in the bonding station.

4. The thermocompression bonder of claim 1 wherein the heated bonding tool heats solder contact portions of the semiconductor element to a temperature just below the melt temperature of the solder contact portions before contact between ones of the solder contact portions of the semiconductor element and ones of the conductive contacts of the substrate.

5. The thermocompression bonder of claim 1 wherein the flux material applied by the flux application tool is used in connection with a thermocompression bonding process between conductive structures of the semiconductor element and corresponding conductive contacts of the substrate.

6. The thermocompression bonder of claim 1 wherein the flux application tool is configured to selectively apply the flux material only on the conductive contacts of the substrate.

7. The thermocompression bonder of claim 1 wherein the material handling system includes a motion system for moving the substrate between the fluxing station and the bonding station.

8. The thermocompression bonder of claim 1 wherein application of the flux material by the flux application tool is electronically controlled using a computer included in the thermocompression bonder.

9. The thermocompression bonder of claim 1 wherein the support structure of the fluxing station is heated to activate the applied flux material without evaporating the flux material.

10. A method of operating a thermocompression bonding machine, the method comprising the steps of:
    (a) applying a flux material to conductive structures on a substrate using a movable flux application tool of a fluxing station of the thermocompression bonding machine;

(b) moving the substrate from the fluxing station to a bonding station of the thermocompression bonding machine; and (c) bonding conductive structures of a semiconductor element to conductive structures of the substrate after steps (a) and (b) using a heated bonding tool of the bonding station.

11. The method of claim 10 wherein step (a) includes applying the flux material using at least one of a flux stamp, a flux jet, a flux printer, and a flux screen printer.

12. The method of claim 11 wherein the fluxing station includes a support structure for supporting the substrate during step (a).

13. The method of claim 10 wherein the bonding station includes a support structure for supporting the substrate during step (c).

14. The method of claim 13 wherein a support structure included at the fluxing station is different from the support structure of the bonding station.

15. The method of claim 10 further comprising the step of heating solder contact portions of the conductive structures of the semiconductor element to a temperature just below the melt temperature of the solder contact portions before contact between ones of the solder contact portions and ones of the conductive structures of the substrate.

16. The method of claim 10 wherein step (a) includes applying the flux material for providing a fluxing effect between the conductive structures of the semiconductor element and corresponding conductive structures of the substrate during step (b).

17. The method of claim 10 wherein step (a) includes selectively applying the flux material only on the conductive structures of the substrate.

18. The method of claim 10 wherein step (a) includes electronically controlling application of the flux material by the flux application tool using a computer included in the thermocompression bonder.

19. The method of claim 10 further comprising the step of heating the substrate using a support structure for supporting the substrate at the fluxing station of the thermocompression bonder during step (a) to activate the applied flux material without evaporating the flux material.

\* \* \* \* \*